United States Patent [19]

Gangulee et al.

[11] 4,319,264

[45] Mar. 9, 1982

[54] NICKEL-GOLD-NICKEL CONDUCTORS FOR SOLID STATE DEVICES

[75] Inventors: Amitava Gangulee, Croton-on-Hudson; Paul S. Ho, Chappaqua; James K. Howard, Fishkill; Robert J. Miller, Yorktown Heights, all of N.Y.

[73] Assignee: International Business Machines Corporation, Armonk, N.Y.

[21] Appl. No.: 103,970

[22] Filed: Dec. 17, 1979

[51] Int. Cl.³ .................... H01L 23/48; H01L 29/46; H01L 29/54

[52] U.S. Cl. .................... 357/71; 357/65; 357/68; 357/67

[58] Field of Search .......... 357/65, 68, 71, 67

[56] References Cited

U.S. PATENT DOCUMENTS

| | | | |
|---|---|---|---|
| 3,362,851 | 1/1968 | Dunster | 357/71 |
| 3,362,851 | 1/1968 | Dunster | 117/212 |
| 3,396,454 | 8/1968 | Murdock et al. | 357/71 |
| 3,409,974 | 11/1968 | Lueck et al. | 357/71 |
| 3,419,765 | 12/1968 | Clark et al. | 317/234 |
| 3,551,842 | 12/1970 | Nelson | 357/71 |
| 3,617,816 | 11/1971 | Riseman | 317/234 |
| 3,631,304 | 12/1971 | Bhatt | 317/234 L |
| 3,645,785 | 2/1972 | Hentzschel | 117/217 |
| 3,663,184 | 5/1972 | Wood et al. | 29/195 |
| 3,679,472 | 7/1972 | Crosby et al. | 17/212 |
| 3,715,234 | 2/1973 | Stott | 117/217 |
| 3,717,563 | 2/1973 | Revitz et al. | 204/192 |
| 3,743,894 | 7/1973 | Hall et al. | 317/234 R |
| 3,781,596 | 12/1973 | Galli et al. | 317/101 F |
| 3,959,522 | 5/1976 | Ladany et al. | 427/89 |
| 3,982,908 | 9/1976 | Arnold | 29/195 |

FOREIGN PATENT DOCUMENTS 2440481  4/1975  Fed. Rep. of Germany .

Primary Examiner—Andrew J. James
Attorney, Agent, or Firm—Graham S. Jones II; Yen S. Yee

[57] ABSTRACT

A laminated conductor includes a lower thin film of nickel deposited upon a substrate containing silicon. Upon the film of nickel, a thicker film of gold is deposited as the conductive portion of the conductor. On the upper surface of the gold layer is deposited a thin film of nickel. Failure of the conductor because of electromigration is reduced dramatically as compared with use of molybdenum instead of nickel in the laminated structure.

9 Claims, 1 Drawing Figure

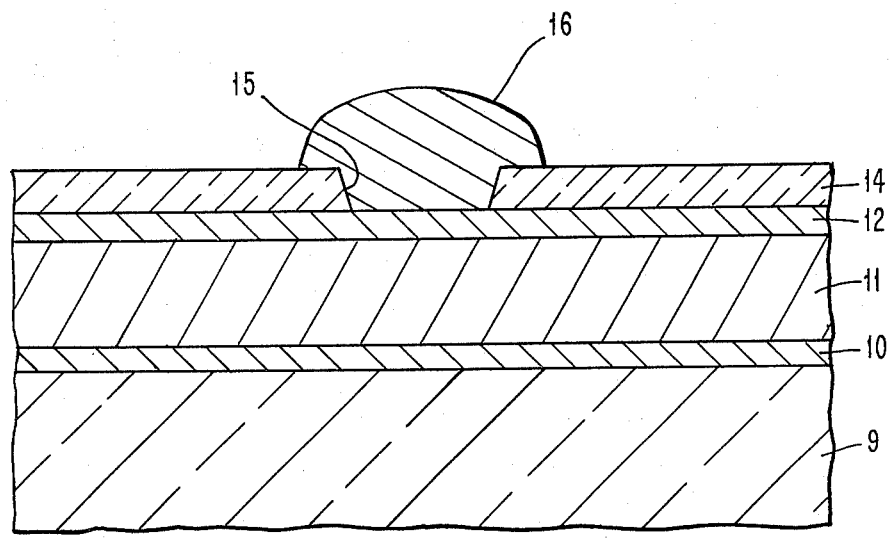

NICKEL-GOLD-NICKEL CONDUCTORS FOR SOLID STATE DEVICES

BACKGROUND OF THE INVENTION

1. Field of the Invention

This invention relates to conductors for solid state devices and more particularly to multiple layer conductors.

2. Description of Prior Art

To increase performance of integrated circuits, the trend in the semiconductor industry is toward smaller devices electrically connected by very narrow thin film conductors. In current products, typical current densities to which these thin film conductors are subjected are in the mid-$10^5$ amperes/cm$^2$ range. New device designs call for higher current densities, in some cases, as high as the mid-$10^6$ amperes/cm$^2$ range.

Direct current in these current density ranges induces motion of the atoms comprising the thin film conductor, an effect known as electromigration. Electromigration induces crack or void formation in the conductor which, over a period of time, can result in conductor failure. The rate of electromigration is dependent on the current density imposed on the conductor, the conductor temperature, and the properties of the conductor material. In high current density applications, potential conductor failure due to electromigration can severely limit the reliability of the circuit. Electromigration can cause an additional problem in semiconductor devices when a passivation layer such as glass, silicon nitride, or silicon dioxide is overlaid on the device, as is typically done in the industry. This layer can fracture as a result of the removal and build-up of conductor material. This fracture can expose some of the devices or conductors to atmospheric corrosion.

Conventionally in the microelectronics industry, aluminum (Al) has been used as the conductor material. For the current density requirements of some Large Scale Integration (LSI) semiconductor applications, pure aluminum conductors are unreliable because of their susceptibility to electromigration. Several metallurgical systems have been proposed previously in which electromigration occurs more slowly than in pure alumina conductors, thus leading to longer conductor life or the ability to impose higher current densities on the conductor. Among the proposed metallurgical systems are Al-Cu, Ta/Au/Ta, Al-intermetallic configurations and Au-intermetallic configurations.

The basic requirements which a metal or metal system (i.e., a configuration of one or more metals, either as an alloy, pseudo-alloy, or layered structure) must achieve in order to be a suitable candidate for use as a thin film conductor in integrated, solid state circuits are summarized as follows:

(1) high electrical conductivity—only materials having high electrical conductivity are considered because low conductivity values lead to excessive Joule heating and too large a voltage loss in the conductor, or the alternative of making the conductor with an unacceptably large cross-sectional area.

(2) corrosion resistance—conductor materials which are susceptible to corrosion, even if they are relatively resistant to electromigration induced failure, are prone to fail from corrosion effects over the intended lifetime of the device.

(3) chemical stability with regard to other materials with which the conductor will be in contact in the integrated circuit; such materials are typically silicon, silicon dioxide, silicon nitride, or gadolinium gallium garnet.

(4) adhesion to the substrate on which the thin film conductor is fabricated, and adhesion to the passivating layer applied over the thin film conductor. This passivating layer insulates the conductor and provides a degree of protection against corrosion. Thus, adhesion to such materials as silicon, silicon dioxide and silicon nitride is required.

(5) compatibility with later processing of the integrated circuit. This compatibility may take the form of metallurgical stability under elevated temperature conditions encountered in processing, and resistance to chemical attack by certain chemical agents to which the conductor may become exposed in processing.

(6) ability to be deposited by the fabrication techniques in common use within the industry for metal deposition, for example by vapor deposition or by sputter deposition.

(7) certain properties of the film's grain structure are also important. In order to obtain adequate lithographic linewidth resolution, the film should be small grained, with a grain size not exceeding about one-third of the required linewidth. Uniformity of grain size and preferred crystallographic orientation of the grains are also factors which promote longer electromigration limited conductor lifetimes. Fine grained films are also smoother, which is a desirable quality in semiconductor applications to lessen difficulties associated with covering the conductor with an overlayer.

No single metal is exceptionally well suited to satisfying all of the above requirements. Aluminum, copper, silver, and gold provide high conductivity, but of them only Al adheres well to silicon, silicon dioxide, and silicon nitride. However, the direct contact of Al to silicon must be avoided in a number of semiconductor applications because of mutual solubility, which results in p-doping of silicon and the possibility of junction penetration. Also, pure Al is highly susceptible to electromigration.

Using metal systems (i.e., combinations of metals), significant progress has been achieved toward reducing the effects of electromigration in thin film conductors. A recent review of advances in using Al-based metal systems is provided in U.S. Pat. No. 4,017,890 of Howard et al which is commonly assigned.

Adhesion problems encountered in using Ag, Au or Cu conductors have been overcome by using adhesion layers between the conductor and the material to which it must adhere. However, Ag is susceptible to corrosion. Cu is also susceptible to corrosion, although to a lesser degree.

Au provides a high degree of resistance to electromigration induced failure, and to corrosion, is not attacked by most chemical agents, and is easily deposited in pure form by vapor deposition, sputter deposition or electroplating. With proper techniques of deposition, it forms a small, uniform grain structure, with strong preferred orientation of the (111) crystallographic direction normal to the film plane. Au in conjunction with Ta adhesion layers has been proposed as an electromigration resistant metallurgy for semiconductor applications by Riseman et al in U.S. Pat. No. 3,617,816 which is also commonly assigned. Au in conjunction with adhesion layers of Nb, Hf, or Zr, which form intermetallic compounds with Au, has been proposed by Gangulee et al in U.S. Pat. No. 4,166,279, which is commonly assigned, wherein there is also a review of other advances in using Au-based metal systems.

OBJECT OF THE INVENTION

It is an object of this invention to provide an improved new metallurgical conductor system using Au as the conductive layer.

Another object is that the metallurgical system should offer increased resistance to electromigration induced conductor failure as compared to the prior art, and should not depend on the formation of intermetallic compound layers of Au and the adhesion layer metal.

A BRIEF DESCRIPTION OF THE DRAWINGS

FIG. 1 shows a sectional view of a substrate carrying a layered conductor in accordance with this invention.

DESCRIPTION OF THE PREFERRED EMBODIMENT

A three-layered conductor structure Ni/Au/Ni 10, 11, 12 on a substrate 9 is shown in FIG. 1. The Ni layers 10 and 12 act as adhesion layers to silicon, silicon dioxide, and silicon nitride. The Ni layer also acts as a diffusion barrier to keep Au layer 11 from coming into contact with the silicon (Si) substrate 9, an occurrence which would have detrimental effects on the performance of the circuit devices constructed in the silicon 9. The upper layer of nickel 12 is coated with $SiO_2$ passivation layer 14. Layer 12 is connected at opening 15 to solder ball contact 16. Wire bonding can be employed as well. Alternatively, the conductors can be deposited upon other layers of semiconductor devices or other solid state devices rather than directly upon substrate 9. For example, such conductors conventionally make contact to or interconnect with semiconductor devices and other active devices. See U.S. Pat. No. 3,725,309 of Ames et al and Riseman et al U.S. Pat. No. 3,617,816 for illustration of some ways in which conductive stripes are employed in accordance with this invention.

Ni does not form intermetallic compounds with Au, but is soluble in Au up to approximately 10 atomic % at the temperatures of interest. Au is not soluble in Ni, and as a result, Au does not easily diffuse through the Ni layers. Therefore, problems such as the loss of adhesion or Au-Si reaction are not encountered. The presence of Ni dissolved in the Au conductor layer 11 results in an increase in the resistivity of that layer. But the magnitude of the increase can be controlled by limiting the annealing time and temperature of the conductor stripe so that the amount of dissolved Ni is limited and the resistivity increase is tolerable for semiconductor applications. A comparison of the relative amounts of resistivity increase caused by various metals dissolved in Au is presented in Table I (layer thicknesses of 100 nm each). Like Au, the Ni can be deposited onto the substrate by evaporation, sputtering or plating, and it forms a smooth, fine grained structure.

TABLE I

| | Resistivity and Resistivity Changes of Various Gold Based Metal Systems | | |
|---|---|---|---|
| Transition Metal-Addition | Gold-Metal Resistivity $\mu\Omega$-cm | Gold Compound Resistivity Increase $\mu\Omega$-cm | % Change In Resistivity |
| Ti | 2.5 | 15.0 | 600 |
| Cr | 2.5 | 30.0 | 1200 |
| V | 2.5 | 80.0 | 3200 |
| Ta | 2.5 | 1.25 | 50 |
| Nb | 2.5 | 0.50-0.75 | 20-30 |
| Hf | 2.5 | 1.0  40 | |
| Zr | 2.5 | 1.25 | 50 |
| Ni | 2.5 | 1.5 | 60 |

The presence of Ni dissolved in the Au conductor layer 11 has a strongly beneficial effect on the ability of that layer to resist electromigration induced failure. Table II presents electromigration lifetimes of various Au-based conductor metal systems subjected to accelerated testing. Each conductor line had a width of 7 $\mu$m and a length of 250 $\mu$m. The accelerated testing subjected the conductors to a D.C. current density of $2 \times 10^6$ amperes/cm$^2$ at a temperature of 300° C. in a non-reactive ($N_2$) atmosphere. A minimum of eleven conductors of each metal system was tested.

The lifetime value of the Mo/Au/Mo conductors can be taken as representative of the lifetime of a pure Au conductor since Mo and Au do not interdiffuse, nor do they form intermetallic compounds with one another. The lifetimes of the Nb/Au/Nb, Zr/Au, and Hf/Au conductors are representative of those systems which do form Au intermetallic compounds.

TABLE II

| Electromigration Lifetimes of Various Gold Based Conductor Metal Systems | | |
|---|---|---|
| Layer Configuration | Thickness (nm) [$10^{-9}$m] | Median Lifetime (hrs) |
| Mo/Au | 25/400 | 300 |
| Zr/Au | 25/400 | 800 |
| Hf/Au | 25/400 | 700 |
| Mo/Au/Mo | 25/400/25 | 1500 |
| Nb/Au/Nb | 25/400/25 | 19,000+ |
| Ni/Au/Ni | 25/400/25 | 19,000+ |

Temperature 300° C.
Current Density $2 \times 10^6$ amperes/cm$^2$

The increased ability of Ni/Au/Ni to resist electromigration induced failure appears to be a result of Ni atoms being present within Au grains and at grain boundaries throughout the Au layer, unlike the case of three-layer metal systems which form intermetallic compounds. In those systems, the intermetallic compounds forms primarily as a planar layer at the Au-/adhesion layer interface, rather than throughout the full height of the Au conductor film thickness, and the Au grains have few or no adhesion layer atoms within them. This latter point can be inferred from the determination that the solubility of those materials in Au is small.

A high degree of flexibility is available in the details of fabricating Ni/Au/Ni thin film conductors. This allows the fabrication method and the layer thicknesses to be tailored to the specific application. To achieve optimum performance of the invention, some guidelines should be followed. It is preferable that the sequential depositions of the three layers (Ni, Au and Ni) be performed in the same deposition system within a single pumpdown (i.e., without a return to atmospheric pressure between the layers) to avoid the opportunity for surface contaminants carried by the atmosphere to collect on the metal surfaces. Each Ni layer should be sufficiently thick that it becomes a continuous adhesion layer, and so that it is adequately effective as a barrier against the diffusion of Au to the substrate surface. However, any thickness exceeding that is permissible. A practical minimum is about 10 nm with the maximum being some 100 nm or more, depending on the tolerable total thickness of the three-layer structure. The Au thickness is in general fabricated no less than twice the thickness of either Ni layer, in order that the Au act as the primary current carrier. The specific application and fabrication procedures generally restrict the maximum thickness of the entire three-layer structure, since making thin film conductors appreciably thicker than they are wide becomes impractical in the industry. Typical Au thicknesses range from 100 nm to 2000 nm. Once the layers have been deposited to their appropriate thicknesses, the substrate carrying the layers should be heat treated at a temperature between 200° C. and 400° C. for a time period of sufficient length to permit dissolution of Ni atoms into the Au layer. The occurrence of this dissolution is detectable by the change in resistance of the thin film structure.

As an example of the application of these guidelines, one preferred embodiment of the invention is described. The embodiment presented is that used to obtain samples for the lifetest data presented in Table II. The three layers (Ni, Au and Ni) were deposited by electron beam evaporation in a vacuum chamber maintaining a vacuum of $10^{-6}$ Torr. The three depositions were performed sequentially in the chamber in a single pumpdown onto oxidized silicon substrates maintained at ambient temperature. The first Ni layer was deposited onto the substrate to a thickness of 25 nm, then the Au layer was deposited onto the Ni layer to a thickness of 400 nm. Then the upper Ni layer was deposited onto the Au layer to a thickness of 25 nm. The deposited films were patterned into individual conductors by means of ion milling, using a photoresist stencil as the milling mask. A passivating overlayer was not deposited onto these patterned conductors; although such practice would be common in the industry, and has been shown to increase the electromigration limited lifetime of thin film conductors. Prior to testing, the conductors were annealed at 300° C. in forming gas (90% $N_2$ 10% $H_2$) for 16 hours to permit Ni diffusion into Au to occur. The methods of deposition and patterning herein employed are in routine use within the semiconductor industry. The annealing temperature is similar to that which the devices would incur in later processing, and is fully compatible with those processing conditions common to the industry.

INDUSTRIAL APPLICABILITY

This invention is useful in the manufacture of thin film electronic and magnetic circuits on a very large scale wherein conductors must be deposited upon silicon, silicon dioxide and other substrates which are not compatible with using gold by itself as a conductor and which require conductor lifetimes in excess of those obtained with pure gold conductors. As gold and many other metals suffer from failure induced by electromigration, this combination permits overcoming of failures caused by electromigration or at least ameliorates problems associated with that phenomenon to a significant degree.

Having thus described our invention, what we claim as new and desire to secure by Letters Patent is:

1. A conductor line for a solid state circuit supported by a substrate comprising
   a first layer of nickel deposited upon said substrate as the base of said conductor line, an intermediate layer of gold deposited upon said first layer, and
   a third layer of nickel deposited upon said layer of gold, said first layer of nickel and said third layer of nickel being within the range from on the order of $10 \times 10^{-9}$ to on the order of $100 \times 10^{-9}$ meters thick and said gold layer being on the order of micrometers wide and within the range from on the order of $100 \times 10^{-9}$ to on the order of $2000 \times 10^{-9}$ thick, for a conductor line having a width for said thickenesses adapted for carrying current densities reaching to on the order of the mid-$10^6$ amperes/cm$^2$ range,
   whereby the electromigration lifetime of such a conductor is lengthened by the interaction of the nickel and gold atoms in the structure.

2. A conductor in accordance with claim 1 deposited upon a substrate composed of a material containing silicon with the lower nickel layer of said conductor in contact with said substrate.

3. A conductor in accordance with claim 1 or 2 wherein said layers of nickel are on the order of $25 \times 10^{-9}$ meters thick and said layer of gold is on the order of $400 \times 10^{-9}$ meters thick.

4. A conductor in accordance with claim 1 or 2 wherein said layers of nickel are on the order of $25 \times 10^{-9}$ meters thick and said layer of gold is on the order of $400 \times 10^{-9}$ meters thick, and said conductor has a width on the order of $7 \times 10^{-6}$ meters.

5. A conductor in accordance with claim 1 or 2 wherein said layers of nickel and gold were deposited by electron beam evaporation in a vacuum chamber.

6. A conductor in accordance with claim 1 or 2 wherein said layers of nickel and gold were deposited by electron beam evaporation in a vacuum chamber and were patterned by means of ion milling while employing a photoresist stencil as a mask, followed by annealing at about 300° C. in forming gas for several hours to diffuse Ni into Au.

7. A conductor in accordance with claim 1 wherein said gold layer includes nickel atoms dissolved into said gold layer.

8. A conductor in accordance with claim 7 wherein said nickel and gold layers comprise annealed layers with diffusion of said nickel atoms into said gold layer.

9. A conductor line for a solid state circuit supported by a substrate, comprising:
   a first layer of nickel deposited upon said substrate; an intermediate layer of gold deposited upon said first layer of nickel; and
   a third layer of nickel deposited upon said intermediate layer of gold;
   said intermediate layer of gold having a thickness greater than the thickness of each of said first and third layers of nickel, and being adapted for carrying current densities reaching to on the order of the mid-$10^6$ amperes per cm$^2$ range;
   whereby the electromigration lifetime of said conductor line is lengthened by the interaction of the nickel and gold atoms in said conductor line.

* * * * *